US007535242B2

United States Patent
Stott et al.

(10) Patent No.: US 7,535,242 B2
(45) Date of Patent: May 19, 2009

(54) INTERFACE TEST CIRCUIT

(75) Inventors: Bret Stott, Menlo Park, CA (US); Philip Yeung, Mountain View, CA (US); John W. Brooks, San Jose, CA (US); Benedict Lau, San Jose, CA (US); Chanh V. Tran, San Jose, CA (US); Eugene C. Ho, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 233 days.

(21) Appl. No.: 11/417,964

(22) Filed: May 3, 2006

(65) Prior Publication Data
US 2007/0257693 A1 Nov. 8, 2007

(51) Int. Cl.
*G01R 31/26* (2006.01)
(52) U.S. Cl. ..................................... 324/763
(58) Field of Classification Search ................. 324/763, 324/760, 765, 158.1; 365/201; 714/733–737
See application file for complete search history.

(56) References Cited

U.S. PATENT DOCUMENTS

| 5,787,114 | A | 7/1998 | Ramamurthy et al. | ........ 375/221 |
| 5,790,563 | A | 8/1998 | Ramamurthy et al. | ........ 371/25.1 |
| 6,853,588 | B2 * | 2/2005 | Kim et al. | .............. 365/189.14 |
| 7,111,208 | B2 * | 9/2006 | Hoang et al. | ................. 714/716 |
| 7,231,306 | B1 | 6/2007 | Rajan et al. | .................... 702/89 |
| 7,256,599 | B2 * | 8/2007 | Matsuno | ...................... 324/763 |
| 2004/0068683 | A1 | 4/2004 | Hoang et al. | ................. 714/716 |
| 2004/0250180 | A1 | 12/2004 | Hotta | .......................... 714/699 |
| 2005/0077905 | A1 | 4/2005 | Sasaki | ......................... 324/500 |

FOREIGN PATENT DOCUMENTS

DE      102004034606 A1    2/2006

OTHER PUBLICATIONS

International Search Report and Written Opinion for International Application No. PCT/US2007/068177, mailed Nov. 13, 2007.

* cited by examiner

*Primary Examiner*—Ha Tran T Nguyen
*Assistant Examiner*—Tung X. Nguyen
(74) *Attorney, Agent, or Firm*—Morgan, Lewis & Bockius LLP

(57) ABSTRACT

An integrated circuit is described. The integrated circuit includes an interface circuit that includes a transmitter and a receiver. A generator in the integrated circuit is selectively coupled to the transmitter. The generator is to provide a test sequence that is output by the transmitter during a test mode of operation. A memory in the integrated circuit is selectively coupled to the generator and the receiver. The memory is to receive and synchronize the test sequence and a signal corresponding to the test sequence that is received by the receiver. A logic circuit in the integrated circuit is to compare the test sequence and the signal.

26 Claims, 7 Drawing Sheets

INTERFACE TEST CIRCUIT

FIELD

The subject matter disclosed herein relates generally to self-test circuits for use in integrated circuits, and in particular, to self-test circuits and associated methods for determining communication channel margin in interface circuits.

BACKGROUND

Manufacture testing, characterization and failure analysis of integrated circuits is often complicated and time consuming, especially when circuits are tested at full speed over a range of functional and electrical conditions. While there are unique features associated with each aspect of the testing, there is also considerable overlap both in the testing and in the silicon features that support them. Many existing approaches utilize elaborate external test environments, including a tester. The use of such equipment may increase the cost of manufacturing integrated circuits.

The testing of interface circuits poses additional challenges. During testing, complicated test patterns are often exchanged between the device under test and the tester. Unfortunately, data rates for communication between devices and testers are often lower than the full speed operating data rates of the circuits being tested. As a consequence, test patterns are usually either stored in the device during testing in a memory or buffer, which adds additional expense, or the testing is gated by the communication between the device and the tester. When the test patterns are stored in the device during testing, synchronization of the test results and the corresponding test patterns may be necessary. This is often accomplished by providing external synchronization signals to the device under test. This may further increase the complexity and expense associated with device testing.

There is a need, therefore, for improved approaches for testing and/or characterizing integrated circuits.

BRIEF DESCRIPTION OF THE DRAWINGS

For a better understanding, reference should be made to the following detailed description taken in conjunction with the accompanying drawings, in which.

Like reference numerals refer to corresponding parts throughout the drawings.

DETAILED DESCRIPTION OF EMBODIMENTS

Figure 1:
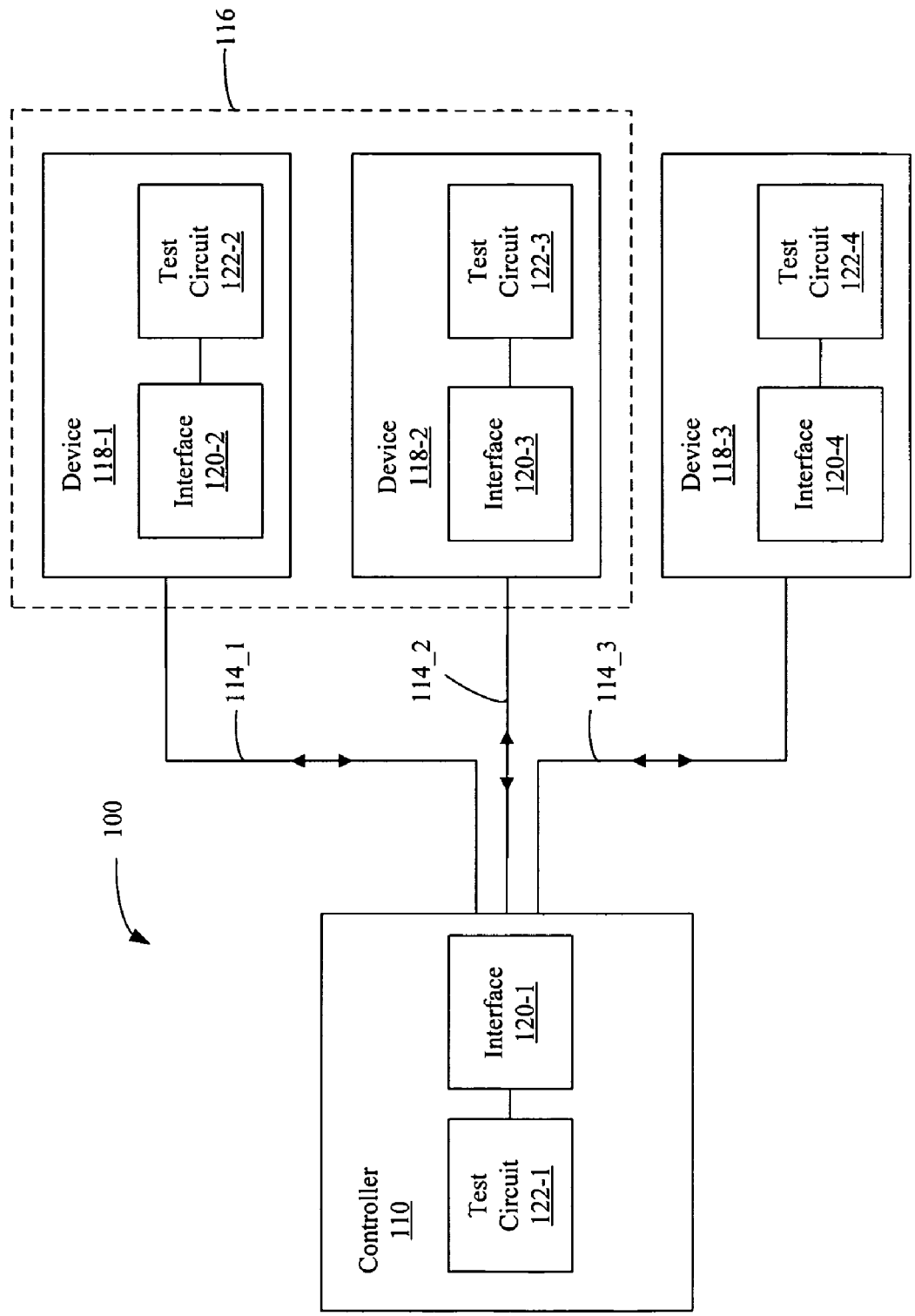
FIG. 1 is a block diagram illustrating an embodiment of a system.

An integrated circuit includes an interface circuit that includes a transmitter and a receiver. A generator in the integrated circuit is selectively coupled to the transmitter. The generator is to provide a test sequence that is output by the transmitter during a test mode of operation. A memory in the integrated circuit is selectively coupled to the generator and the receiver. The memory is to receive and synchronize the test sequence and a signal corresponding to the test sequence that is received by the receiver. A logic circuit in the integrated circuit is to compare the test sequence and the signal. The comparison may be during at least one clock cycle. If there is a difference, the logic circuit is to assert an error condition.

The integrated circuit may be included in a memory controller and/or a memory device.

The test sequence may be a pseudorandom sequence. The test sequence may include burst patterns that result in transient and steady-state responses.

The memory may include a first-in first-out memory.

The transmitter may transmit a first set of data bits and a first clock signal in parallel with one another. The receiver may receive a second set of data bits and a second clock signal in parallel with one another.

A relative phase of a clock signal that gates the receiver and the signal may be adjustable over a range of values thereby allowing determination of a total communication channel margin or error margin.

In some embodiments, the integrated circuit further includes control logic to configure the integrated circuit in the test mode of operation. The control logic may selectively couple the generator to the transmitter and the memory. The control logic may selectively couple the receiver to the memory. The transmitter may be coupled to the receiver during the test mode of operation with a loop external to the integrated circuit. The control logic may set a termination impedance of the transmitter and a termination impedance of the receiver. More generally, the control logic may set one or more electrical characteristics of the transmitter and/or the receiver. The control logic may disable at least one additional transmitter and at least one additional receiver in the interface circuit.

A method of determining a communication channel margin or error margin in an integrated circuit during a test mode of operation includes providing a test sequence to a transmitter and a memory in the integrated circuit; outputting the test sequence with the transmitter; receiving a signal corresponding to the test sequence with a receiver in the integrated circuit; providing the signal to the memory; synchronizing the test sequence and the signal; comparing the test sequence and the signal. The comparing may be during at least one clock cycle in the integrated circuit. In some embodiments, the method further comprises asserting an error condition if there is a difference between the test sequence and the signal.

In some embodiments, the method further includes generating a test sequence with a generator in the integrated circuit. In some embodiments, the method further includes selectively coupling the generator to the transmitter and the memory, and selectively coupling the receiver to the memory.

In some embodiments, the method further includes coupling the transmitter to the receiver with an external loop. The external loop may have an impedance and a length that corresponds to a communication channel between the integrated circuit and another integrated circuit.

In some embodiments, the method further includes disabling at least one additional transmitter and at least one additional receiver in the integrated circuit. In some embodiments, the method further includes setting a termination impedance of the transmitter and/or setting a termination impedance of the receiver in accordance with a signaling protocol. In this way, the transmit and/or receive characteristics may be configured to emulate real channel characteristics.

In some embodiments, the method further includes determining a total communication channel margin in the integrated circuit by adjusting a relative phase of a clock signal that controls sampling of the signal by the receiver over a range of values. In some embodiments, the method further includes determining a transmit communication channel margin or error margin. The transmit communication channel margin may be determined with an oscilloscope. In some embodiments, the method further includes determining a receive communication channel margin or error margin in accordance with the total communication channel margin and the transmit communication channel margin.

By incorporating the circuit and performing an associated method, faster, lower cost and/or more accurate characterization and/or testing of one or more integrated circuits may be enabled. In this way, at least some of the aforementioned challenges associated with existing testers may be reduced and/or eliminated.

Reference will now be made in detail to embodiments, examples of which are illustrated in the accompanying drawings. In the following detailed description, numerous specific details are set forth in order to provide a thorough understanding of the subject matter presented herein. However, it will be apparent to one of ordinary skill in the art that the subject matter may be practiced without these specific details. In other instances, well-known methods, procedures, components, and circuits have not been described in detail so as not to unnecessarily obscure aspects of the embodiments.

A test circuit and related methods are described. The test circuit may be included in an integrated circuit. The test circuit may be used to characterize and/or test an interface circuit and an associated communication channel. In some embodiments, the test circuit may be used in conjunction with an oscilloscope to determine a transmit communication channel margin, a receive communication channel margin and/or a total communication channel margin during full speed operation of the interface over a range of electrical and functional conditions. The oscilloscope may be internal or external to the integrated circuit. For example, an internal oscilloscope may include a device or circuit that may determine voltage and/or timing characteristics of signals (such as escope technology developed by Rambus, Inc.). In other embodiments, one or more of the margins may be determined in accordance with simulations (such as SPICE simulations) of one or more characteristics of the integrated circuit.

The test circuit may include a test sequence generator, a memory to receive and synchronize a test sequence (such as a pseudorandom sequence) and a received signal corresponding to the test sequence, and a logic circuit to compare the test sequence and the received signal during at least one clock cycle. The self-test circuit may assert an error condition if a difference is found. In some embodiments, the self-test circuit may store the test sequence, the received signal and/or test results if a difference is found. The test circuit may include control logic to configure the integrated circuit in a test mode of operation. This configuring may include isolating the interface from other portions of the integrated circuit, selectively coupling a transmitter in the interface to the memory, selectively coupling a receiver in the interface to the memory, disabling one or more transmitters and/or one or more receivers in the interface, and/or setting termination impedances of the transmitter and/or the receiver.

During the test mode of operation, the transmitter and the receiver may be coupled to one another using an external circuit board. The external circuit board may provide a link between the transmitter and the receiver that has an impedance and a length that corresponds to a communication channel (sometimes referred to as a channel) between the integrated circuit and another integrated circuit. In some embodiments, the link may include additional features such as vias, couplings and/or connectors that correspond to the communications channel.

The test circuit, therefore, includes a combination of one or more internal loops, which couple the transmitter and the receiver to memory in the integrated circuit, and one or more external loops (for example, the external circuit board), which couple the transmitter to the receiver.

The integrated circuit may be a memory controller and/or a memory device. The memory device may include a memory core that utilizes solid-state memory, semiconductor memory, organic memory and/or another memory material, including volatile and/or non-volatile memory. The memory device may include dynamic random access memory (DRAM), static random access memory (SRAM) and/or electrically erasable programmable read-only memory (EEPROM). The test circuit may be included in one or more components in a memory system, such as a memory controller and/or one or more memory devices. The one or more memory devices may be embedded in one or more memory modules. The memory controller and the one or more memory devices may be on a common or same circuit board. The test circuit may be included in one or more components in other systems, such as those that include logic chips, including a serializer/deserializer, PCI Express and/or other high-speed interfaces or input/output links.

Attention is now directed towards embodiments that address the difficulties associated with existing approaches to testing and characterizing integrated circuits, such as interface circuits. FIG. 1 is a block diagram illustrating an embodiment of a system 100. The system 100 includes at least one controller 110 and one or more devices 118, such as one or more memory devices. While FIG. 1 illustrates the system 100 having one controller 110 and three devices 118, other embodiments may have additional controllers and fewer or more devices 118. Also, while the system 100 illustrates the controller 110 coupled to multiple devices 118, in other embodiments two or more controllers may be coupled to one another. In the embodiment shown in FIG. 1, the controller 110 includes an interface 120-1 and a test circuit 122-1. As shown in FIG. 1, one or more of the devices 118 may also include an interface 120 and a test circuit 122. In some embodiments, some of the devices 118 may not have the interface 120 and/or the test circuit 122. In embodiments where the devices 118 are memory devices, two or more of the devices, such as devices 118-1 and 118-2, may be configured as a memory bank 116.

The controller 110 and the devices 118 are connected by one or more links 114. While the system 100 illustrates three links 114, other embodiments may have fewer or more links 114. The links 114 may be used for bi-directional and/or uni-directional communication between the controller 110 and one or more of the devices 118. Bi-directional communications may be simultaneous in some embodiments, and not simultaneous in other embodiments. In some embodiments, one or more of the links 114 and corresponding transmitters (not shown) and/or receivers (not shown) may be dynamically configured, for example, by control logic (not shown), for bi-directional and/or unidirectional communication.

Data may be communicated on one or more of the links 114 using one or more sub-channels, such as a baseband sub-channel corresponding to a first frequency band and/or a passband sub-channel corresponding to a second frequency band. In some embodiments, such as those where at least one of the links 114 is ac-coupled, the baseband sub-channel does not include 0 Hz (i.e., does not transmit DC signals). In some embodiments, the first frequency band and the second frequency band are orthogonal. In other embodiments there may be substantial overlap of one or more neighboring pairs of frequency bands. A respective sub-channel may also correspond to a group of frequency bands.

One or more of the test circuits 122 may be used to determine performance metrics of a communication system, including at least one of the interfaces 120. The performance metrics may include a receive communication channel margin, a transmit communication channel margin, a total communication channel margin, a mean square error relative to an expected data pattern and/or a bit error rate. In some embodiments, the communication system may include a first interface, such as the interface 120-1, one or more of the links 114 and one or more second interfaces, such as interface 120-2. The test circuits 122 may allow faster, cheaper and/or more accurate characterization of the performance of the communication system, and thus, of one or more interfaces 120, than existing test equipment.

Figure 2:
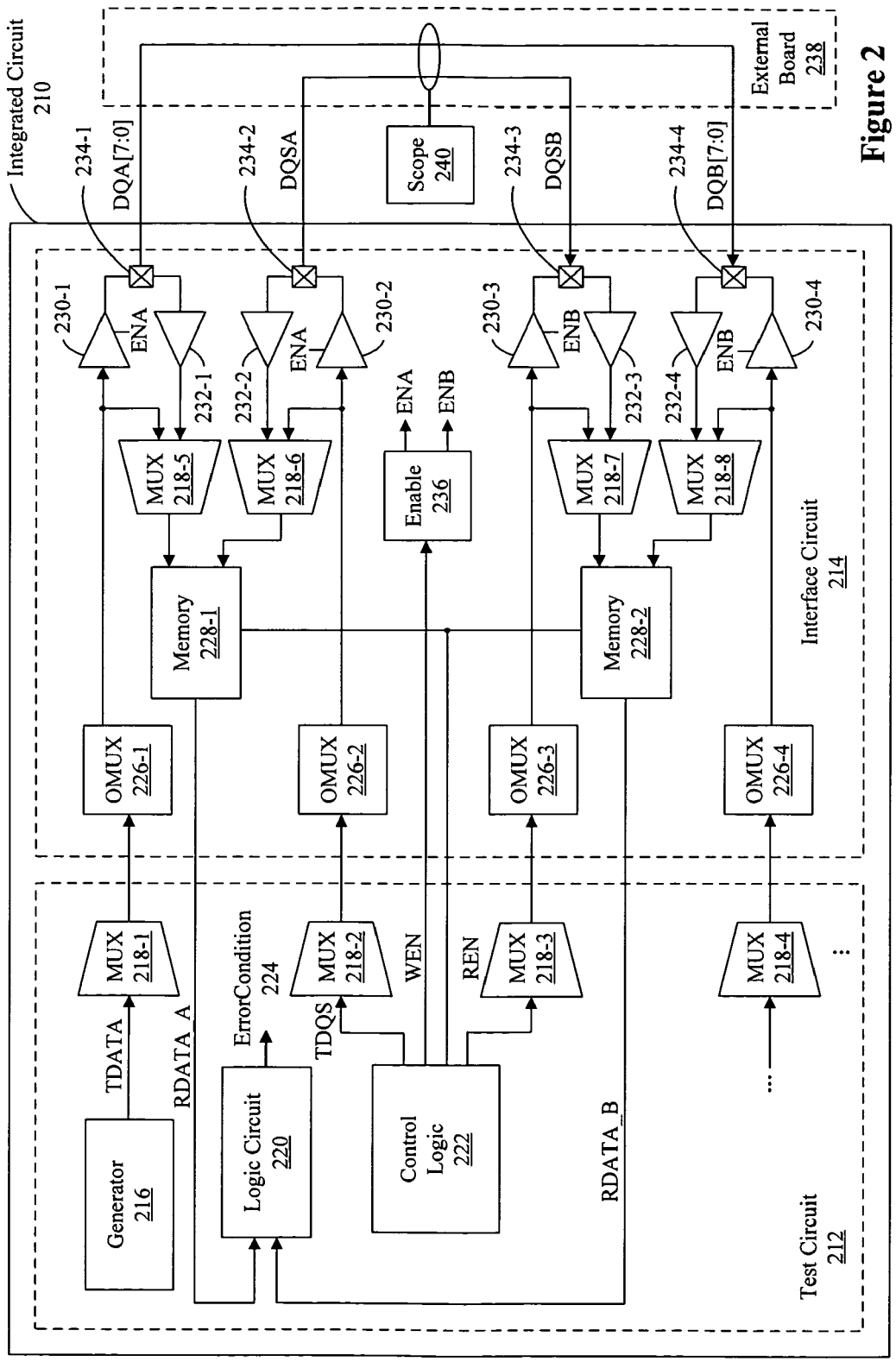
FIG. 2 illustrates an embodiment of an integrated circuit that includes a test circuit and an interface.

FIG. 2 illustrates an embodiment of an integrated circuit 210 that includes a test circuit 212 (such as one of the test circuits 122 in FIG. 1) and an interface circuit 214 (such as one of the interfaces 120 in FIG. 1). During a test mode of operation, control logic 222 may configure the integrated circuit 210 for testing. The configuring operation may include isolating the interface circuit 214 from other portions of the integrated circuit 210, selectively coupling (using one or more multiplexers 218) one or more transmitters 230 in the interface circuit 214 to one or more memories 228 (such as a first-in first-out memory or buffer), selectively coupling (using one or more of the multiplexers 218) one or more receivers 232 in the interface to the memory 228, disabling one or more transmitters 230 and/or one or more receivers 232 in the interface circuit 214, and/or setting termination impedances of the one or more transmitters 230 and/or the one or more receivers 232 (for example, by setting device termination to an ON or an OFF state).

A generator 216 may provide a test sequence to the one or more transmitters 230 and at least one of the memories 228. The test sequence may include a static pattern, a pseudorandom sequence and/or burst patterns that result in transient and steady-state responses (test sequences are discussed in more detail below with reference to FIG. 4). The pseudorandom sequence may include PRBS-7 or PRBS-15. The one or more transmitters 230 may output a signal corresponding to the test sequence. A signal corresponding to the transmitted signal that is received by one or more of the receivers 232 may be coupled to at least the one of the memories 228. At least the one of the memories 228 may be used to synchronize the test sequence and the received signal and to couple the resulting outputs to a logic circuit 220. The logic circuit 220 may compare the test sequence and the received signal during at least one clock cycle. The logic circuit 220 may assert an error condition 224 if a difference is found. In some embodiments, the test circuit 212 may store the test sequence, the received signal and/or test results if a difference is found.

In some embodiments, failure events associated with an error condition 224 may be logged and/or analyzed using circuits, such as the logic circuit 220 and/or additional circuits (not shown). To facilitate such analysis, the logic circuit 220 may provide error notification (such as the asserted error condition 220) that is synchronized to a corresponding test sequence. This may be useful when long test sequences are used. The synchronized error notification may include real-time assertion of a flag (such as the error condition 224) that may be detected by an external tester, oscilloscope and/or logic analyzer. In another embodiments, the synchronized error notification may include a counter that stores a corresponding value when an error occurs. The corresponding test sequence may be regenerated subsequently to determine the data sequence(s) that gave rise to the failure.

In some embodiments, measurement results from an oscilloscope 240, which in conjunction with additional measurements performed in the integrated circuit 210 may be used to determine a receive communication channel margin, a transmit communication channel margin and/or a total communication channel margin. These additional measurements are discussed further below with reference to FIG. 3. In some embodiments, the oscilloscope 240 may have a timing accuracy that is greater than a pre-determined value or a timing error that is less than a pre-determined value.

In an exemplary embodiment, during the test mode of operation an external board 238 may be coupled to the one or more transmitters 230 and the one or more receivers 232 via nodes 234. The external board 238 may include one or more loops. The one or more external loops may have impedances and lengths that correspond to at least a portion of a communication channel between the integrated circuit 210 and one or more additional integrated circuits. For example, the impedance may be 60 Ω. In some embodiments, the link may include additional features such as vias, couplings and/or connectors that correspond to at least a portion of the communications channel. In some embodiments, the external board 238 may be include and/or may be replaced by a loop-back package and/or a set of relays. The control logic 222 may output a write enable (WEN) signal to enable circuit 236. In the embodiment shown in FIG. 2, enable circuit 236 outputs enable A (ENA) and enable B (ENB) signals. The ENA signals enable transmitters 230-1 and 230-2, and the ENB signals disable transmitters 230-3 and 230-4.

The generator 216 outputs the test sequence or test data (TDATA) using multiplexer 218-1 and output multiplexer 226-1 to transmitter 230-1. In embodiments where the integrated circuit 210 is a dual data rate (DDR) memory controller or memory device, the control logic 222 may output a test strobe (TDQS) using multiplexer 218-2 and output multiplexer 226-2 to transmitter 230-2. TDATA and, in DDR embodiments, TDQS may be coupled to memory 228-1 using multiplexers 218-5 and/or 218-6, respectively. The memory 228-1 may store TDATA and/or TDQS for subsequent use, as is discussed further below. Signals corresponding to TDATA may be transmitted by transmitter 230-1, and signals corresponding to TDQS may be transmitted by transmitter 230-2. The data signals from the transmitter 230-1 (DQA) may include a first set of data bits. The strobe signals from the transmitter 230-2 (DQSA), which include a first clock signal, may be transmitted in parallel with the first set of data bits.

Signals corresponding to TDATA may be received using receiver 232-4, and signals corresponding to TDQS may be received using receiver 232-3. The data signals received by the receiver 232-3 (DQB) may include a second set of data bits. The strobe signals received by the receiver 232-3 (DQSB), which include a second clock signal, may be received in parallel with the second set of data bits. The received signals may be coupled to memory 228-2 using multiplexers 218-7 and 218-8. In some embodiments, memory 228-1 and memory 228-2 may be combined into a single memory. The control logic 222 may output a read enable (REN) signal to the memories 228. The memories 228 may output read data A (RDATA_A) and read data B (RDATA_B), respectively, to the logic circuit 220. Synchronization of RDATA_A and RDATA_B by the memories 228 is discussed further below with reference to FIG. 5. The logic circuit 220 may compare RDATA_A and RDATA_B during at least one clock cycle. If a difference is found, the logic circuit 220 may assert the error condition 224. In some embodiments, logic circuit 220 compares RDATA_A and RDATA_B during a sequence of clock cycles and asserts the error condition 224 if RDATA_A and RDATA_B do not match during any of the clock cycles.

Note that in some embodiments, the ENA signals may disable the transmitters 230-1 and 230-2, and the ENB signals may enable the transmitters 230-3 and 230-4. In these embodiments, or in this mode of operation, the roles of the circuitry in the upper and lower halves of FIG. 2 are reversed, compared with when the ENA and ENB signals operate as described earlier. In these embodiments or mode of operation, the generator 216 outputs TDATA using multiplexer 218-4 and output multiplexer 226-4 to transmitter 230-4, and for DDR, the control logic 222 outputs TDQS using multiplexer 218-3 and output multiplexer 226-3 to transmitter 230-3. TDATA and, in DDR embodiments, TDQS are coupled to memory 228-2 using the multiplexers 218-7 and/or 218-8. Signals corresponding to TDATA are transmitted by transmitter 230-4, and signals corresponding to TDQS are transmitted by transmitter 230-3. Signals corresponding to TDATA are received using receiver 232-1, and signals corresponding to TDQS are received using receiver 232-2. The received signals are coupled to memory 228-1 using the multiplexers 218-5 and/or 218-6. The control logic 222 outputs a read enable (REN) signal to the memories 228. The memories 228 output read data A (RDATA_A) and read data B (RDATA_B), respectively, to the logic circuit 220. The logic circuit 220 compares RDATA_A and RDATA_B during at least one clock cycle. If a difference is found, the logic circuit 220 may assert the error condition 224.

By incorporating the test circuit 212, the integrated circuit 210 is able to generate test sequences and perform logical comparisons in close temporal proximity and/or approximately simultaneously. As a consequence, it may not be necessary for an external tester (not shown) to transfer complicated test sequences to the integrated circuit 210 and/or to provide external synchronization or timing signals to the integrated circuit 210 during the test mode of operation. In addition, it may not be necessary for the integrated circuit 210 to transfer test results (including the test sequences and/or the received signals) to the external tester (not shown) in real time, i.e., as the test results are generated. It may not be necessary for the integrated circuit 210 to store all or even most test results. And this approach may allow testing of an impact of cross-talk signals from signal lines that are not-under test (so called aggressors) using arbitrary data patterns. These improvements may allow for faster, less complicated, more accurate and/or less expensive testing of integrated circuit functionality. These improvements, therefore, may allow the interface 214 and/or the associated communication channel to be efficiently tested and/or characterized (such as timing and/or electrical characterization) over a wide range of operating conditions, including full-speed operation using complicated test sequences, a range of operating frequencies, a range of supply voltages and/or a range of temperatures.

In some embodiments, the integrated circuit 210 may include fewer or additional components. For example, the test circuit 210 may include additional instances of transmitters 230 and receivers 232 in the interface circuit 214 for testing command/address interface circuits and/or additional data interfaces, such those shown in the interface circuit 214. In these embodiments, the external board 238 may couple one or more transmitters and/or receivers in the command/address interface circuits with one or more transmitters 230 and/or receivers 232 in the integrated circuit 210. In some embodiments, the integrated circuit 210 may include a serial interface to receive configuration information for the test circuit 212 (for example, from the external tester) and/or for error condition 224 information to be transferred to an external device (such as the external tester). The logical positions of one or more components may be changed. Two or more components may be combined into a single component. Some of the components may be shared by additional components.

As discussed previously, the test circuit, the oscilloscope 240 and/or simulations of one or more characteristics of the integrated circuit 210 may be used to determine one or more communication channel margins. The total communication channel margin is a function of the transmit communication channel margin and the receive communication channel margin. In particular, the total communication channel margin is a sum of the transmit communication channel margin, the receive communication channel margin and a link channel margin or error margin. The total communication channel margin may be determined by performing eye pattern measurements (described further below) while varying a phase of a receive clock signal that gates or determines a sample time of a receiver, such as the receiver 232-4, over a range of phases. This technique, which is referred to as flex phase (a trademark of Rambus, Inc.) or "shmoo," moves the data eye in the eye pattern relative to one or more edges in the receive clock signal. In DDR embodiments, a phase offset or phase shift that is implemented during flex phase measurements may be applied relative to the receive data signal (DQB) or the receive data strobe signal (DQSB).

Similarly, the transmit communication channel margin may be determined by performing eye pattern measurements (described further below) while varying a phase of a transmit clock signal that gates or determines a transmit time of a transmitter, such as the transmitter 230-1, over a range of phases. In DDR embodiments, a phase offset or phase shift that is implemented during these measurements may be applied relative to the transmit data signal (DQA) or the transmit data strobe signal (DQSA). The link channel margin may be determined using simulations. The receive communication channel margin may be determined from the measured total communication channel margin, the measured transmit communication channel margin and the simulated link channel margin.

In some embodiments, the test sequence is a test sequence of addresses and/or commands, in which case the testing described above may be performed on address and/or command signals.

Figure 3:
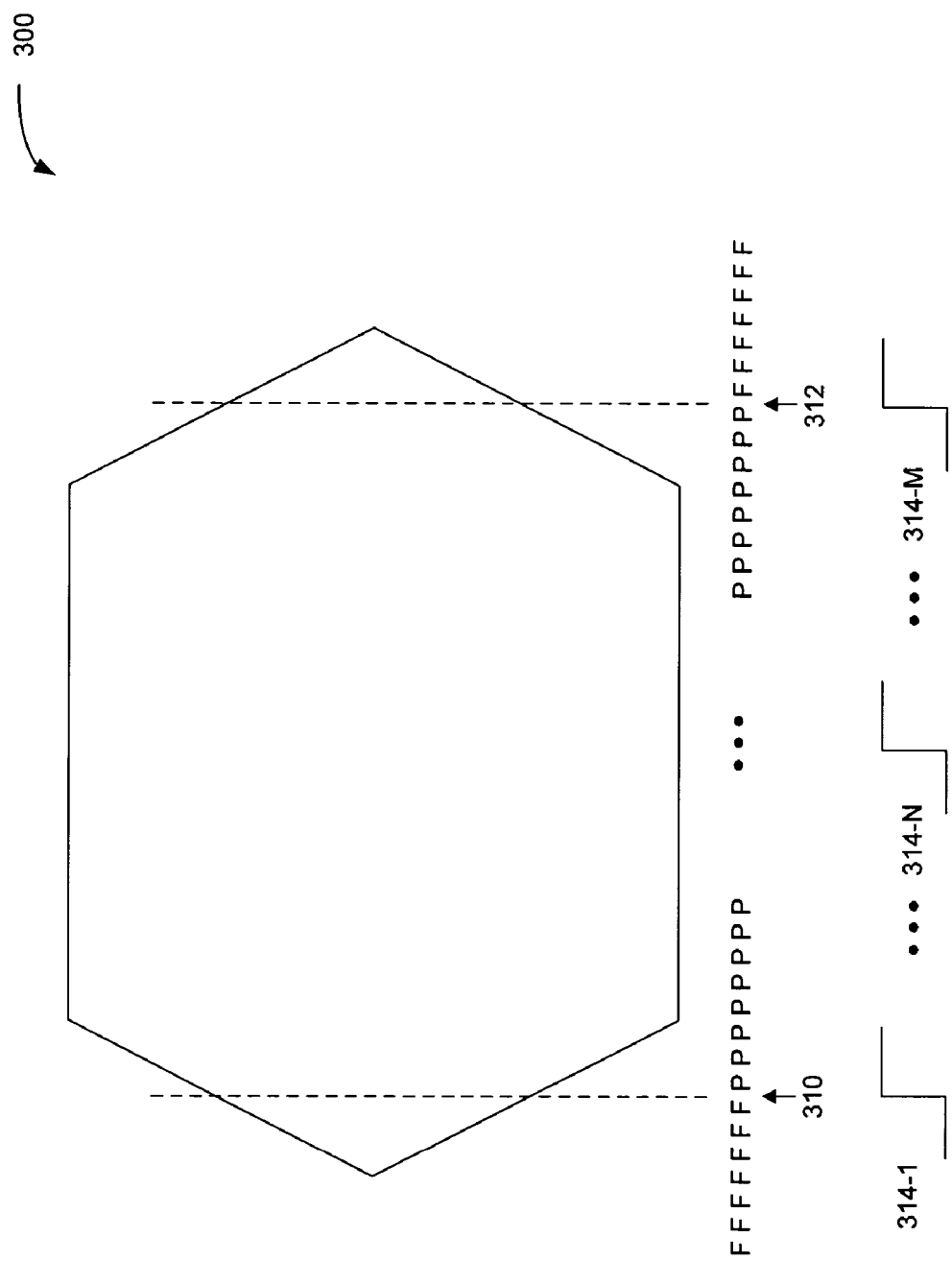
FIG. 3 schematically illustrates an eye pattern and the determination of communication channel margin.

FIG. 3 illustrates an embodiment of an eye pattern 300 and determination of communication channel margin. For the total communication channel margin, the eye pattern 300 may be measured at a receiver, such as the receiver 232-4 (FIG. 2). For the transmit communication channel margin, the eye pattern 300 may be measured at an oscilloscope, such as the oscilloscope 240 (FIG. 2). In either case, the respective communication channel margin corresponds to a respective timing margin for a respective eye pattern.

As illustrated in FIG. 3, a respective timing margin may be determined by adjusting phases 314 of one or more clock signals (such as the clock signal used to determine transmit time for a transmitter and/or the clock signal that determines a sampling time of a receiver). The phase may be swept across the eye pattern 300. Typically, only a subset of the phases 314 will result in an acceptable bit error rate (BER). Phases 314 that yield an acceptable BER may be labeled as passing (P) and phases that yield an unacceptable BER may be labeled as failing (F). The range of allowed phases (i.e., phases with acceptable BER) typically includes a central portion of the eye pattern 300. The range of allowed phases has a left-hand or fail-pass (FP) boundary 310 and a right-hand or pass-fail (PF) boundary 312. These boundaries may define the respective timing margin, and thus, the respective communication channel margin.

Figure 4:
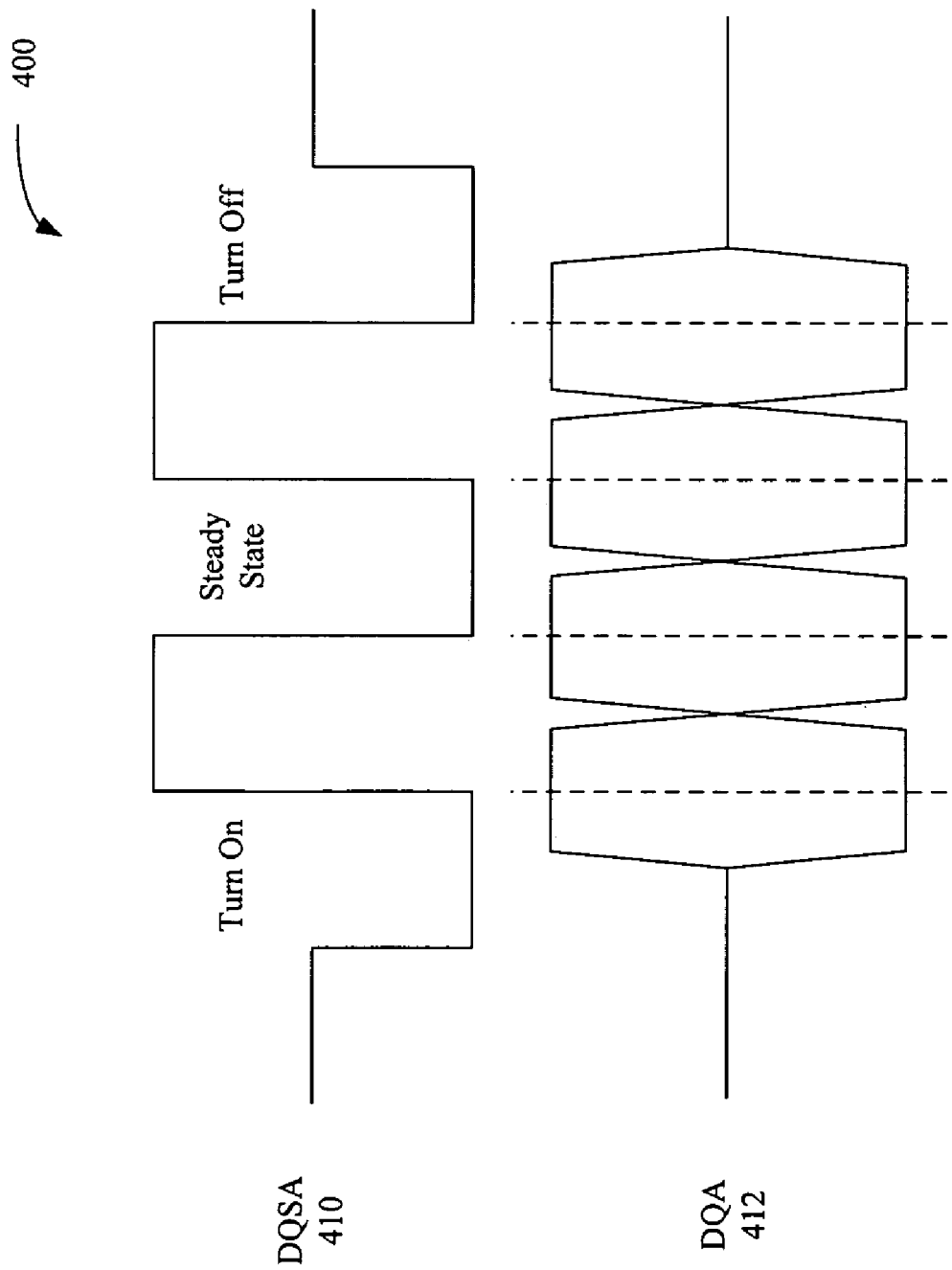
FIG. 4 is a block diagram illustrating an exemplary data strobe and a corresponding data burst.

As discussed previously, in DDR embodiments a strobe TDQS may be used to pulse a clock signal. The pulse may be non-continuous, such as a one shot strobe or an isolated strobe. This often results in data signals that include data bursts. As a consequence, in some embodiments the test sequences include burst patterns that result in transient and steady-state responses. FIG. 4 is a block diagram illustrating an embodiment 400 of a data strobe DQSA 410 and a corresponding data burst DQA 412. The data strobe DQSA 410 includes turn on, steady state and turn off intervals or components. The data burst DQA 412 has 4 data bits or symbols. In some embodiments, data strobes may include two or more burst patterns separated by idle time intervals. In some embodiments, a pseudorandom test sequence may be synchronized with one or more data strobes.

Figure 5:
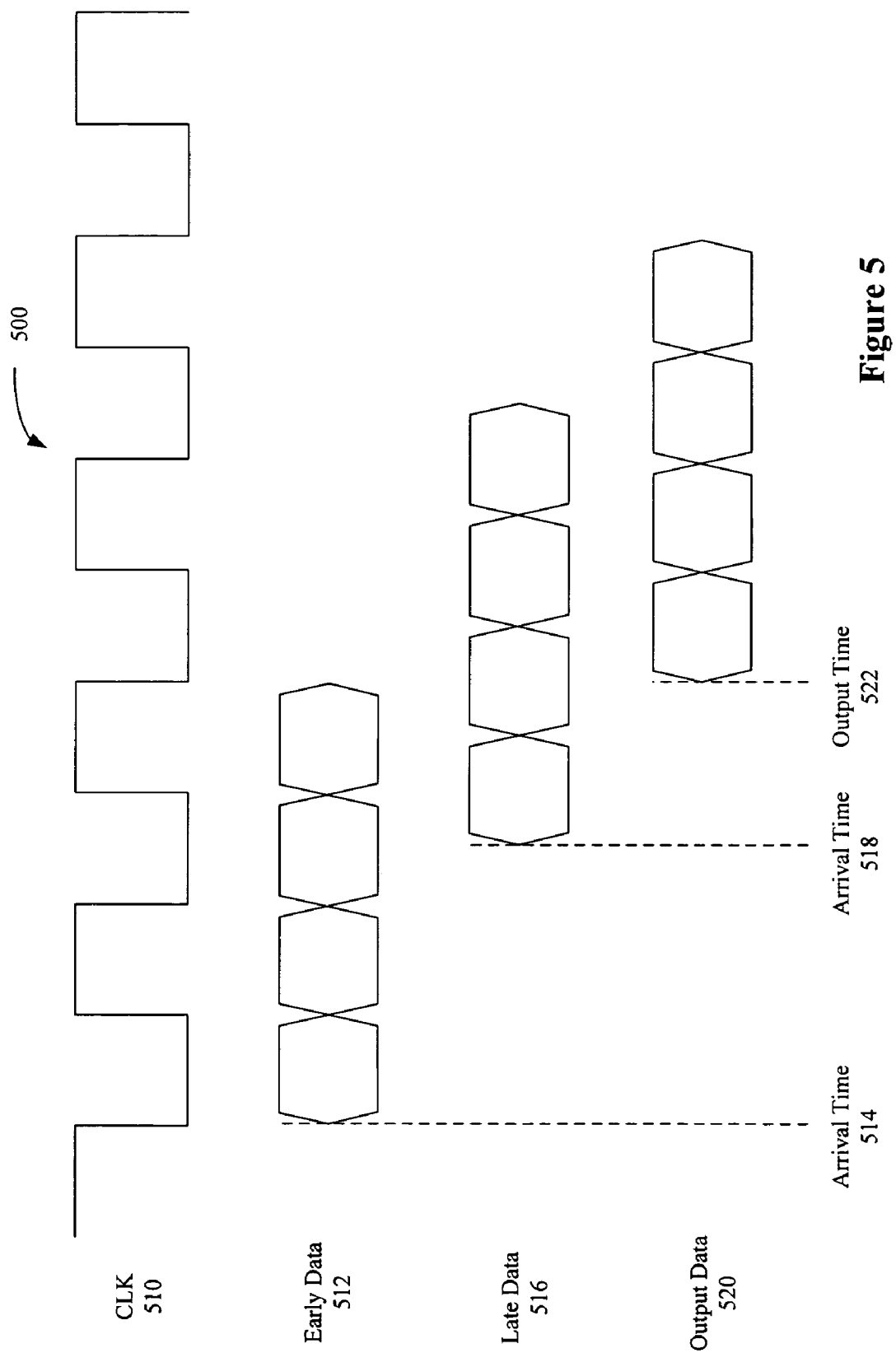
FIG. 5 is a block diagram illustrating exemplary data arrival times.

In order to facilitate comparisons of the test sequence RDATA_A and the received data RDATA_B in the logic circuit 220 (FIG. 2), the test sequence RDATA_A and the received data RDATA_B are synchronized. This synchronization may occur using one or more of the memories 228 (FIG. 2). In some embodiments, the test sequence RDATA_A and the received data RDATA_B may be self-synchronized in one or more of the memories 228 (FIG. 2) if arrival times for these signals are bounded, i.e., are within a pre-determined time interval. This is illustrated in FIG. 5, which is a block diagram illustrating an embodiment 500 of a data arrival times. Early data 512 has a corresponding arrival time 514. Late data 516 has a corresponding arrival time 518. If a size of the memory 228 in FIG. 2 (such as a size of a first-in first-out memory) is chosen in accordance with the range of arrival times 514 and 518 then the test sequence and the received data may be self-synchronized in the memory 228 (FIG. 2) when a read enable (REN) signal leads to output data 520 being output at an output time 522. Data transfers in the embodiment 500 may be in accordance with one or more edges in a clock CLK 510 signal.

Figure 6:
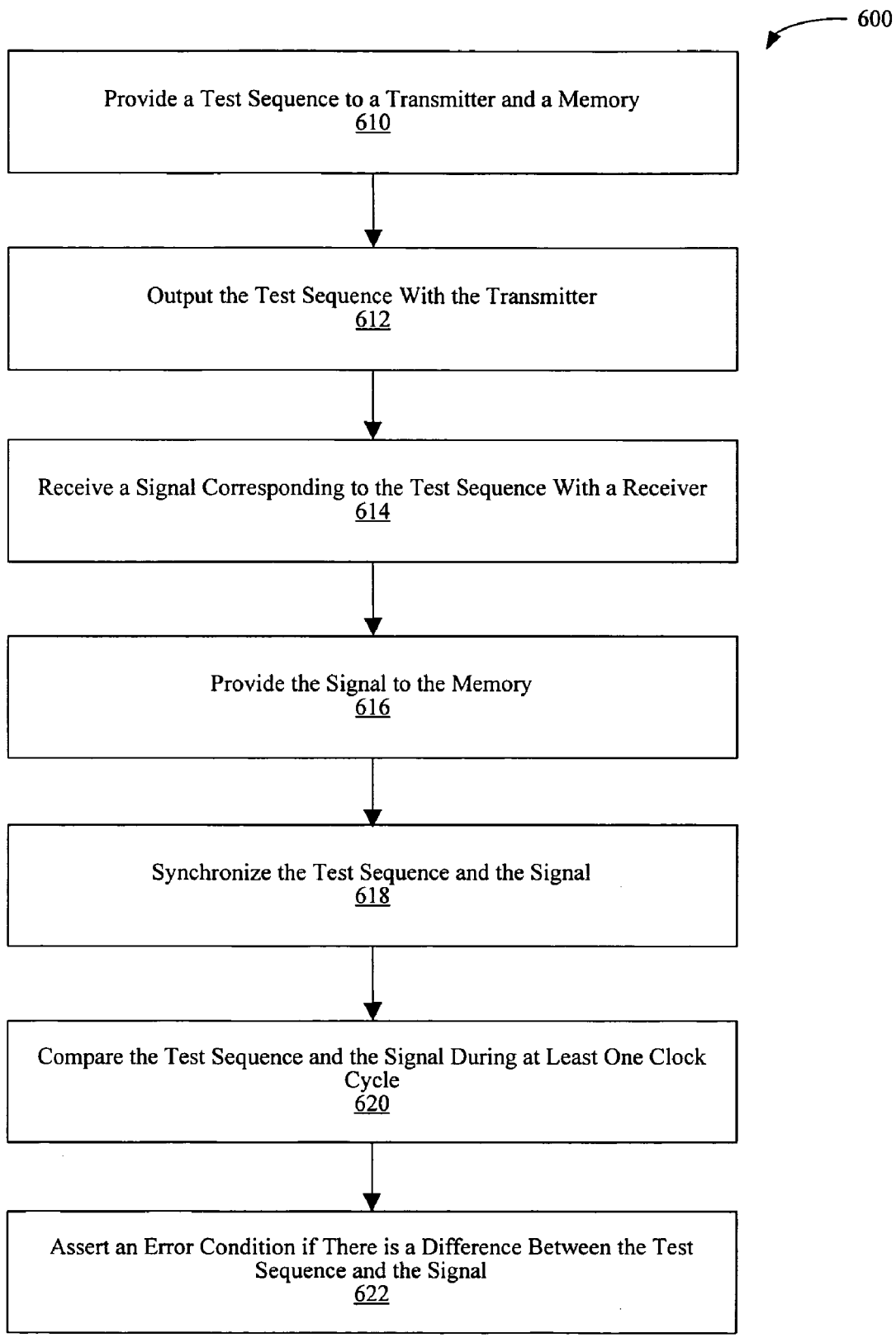
FIG. 6 is a flow diagram illustrating an embodiment of a method of operation of a self-test circuit in an integrated circuit.

Attention is now directed towards processes for operating an interface test circuit. FIG. 6 is a flow diagram illustrating an embodiment 600 of a method of operation of a self-test circuit in an integrated circuit. A test sequence is provided to a transmitter and a memory (610). The test sequence is output with the transmitter (612). A signal corresponding to the test sequence is received with a receiver (614). The signal is provided to the memory (616). The test sequence and the signal are synchronized (618). The test sequence and the signal are compared during at least one clock cycle (620). An error condition is asserted if there is a difference between the test sequence and the signal (622). In some embodiments, there may be fewer or additional operations, an order of the operations may be rearranged and/or two or more operations may be combined.

In some embodiments, a "match" between the test sequence and the signal may be indicated by a mathematical relationship other than equality. For instance, in some embodiments, a match may be indicated when the signal is equal to an inversion of the test sequence. In another example, a match may be indicated when the signal is equal to a pre-defined function of two or more symbols in the test sequence.

Devices and circuits described herein can be implemented using computer aided design tools available in the art, and embodied by computer readable files containing software descriptions of such circuits, at behavioral, register transfer, logic component, transistor and layout geometry level descriptions stored on storage media or communicated by carrier waves. Data formats in which such descriptions can be implemented include, but are not limited to, formats supporting behavioral languages like C, formats supporting register transfer level RTL languages like Verilog and VHDL, and formats supporting geometry description languages like GDSII, GDSIII, GDSIV, CIF, MEBES and other suitable formats and languages. Data transfers of such files on machine readable media including carrier waves can be done electronically over the diverse media on the Internet or through email, for example. Physical files can be implemented on machine readable media such as 4 mm magnetic tape, 8 mm magnetic tape, 3½ inch floppy media, CDs, DVDs and so on.

Figure 7:
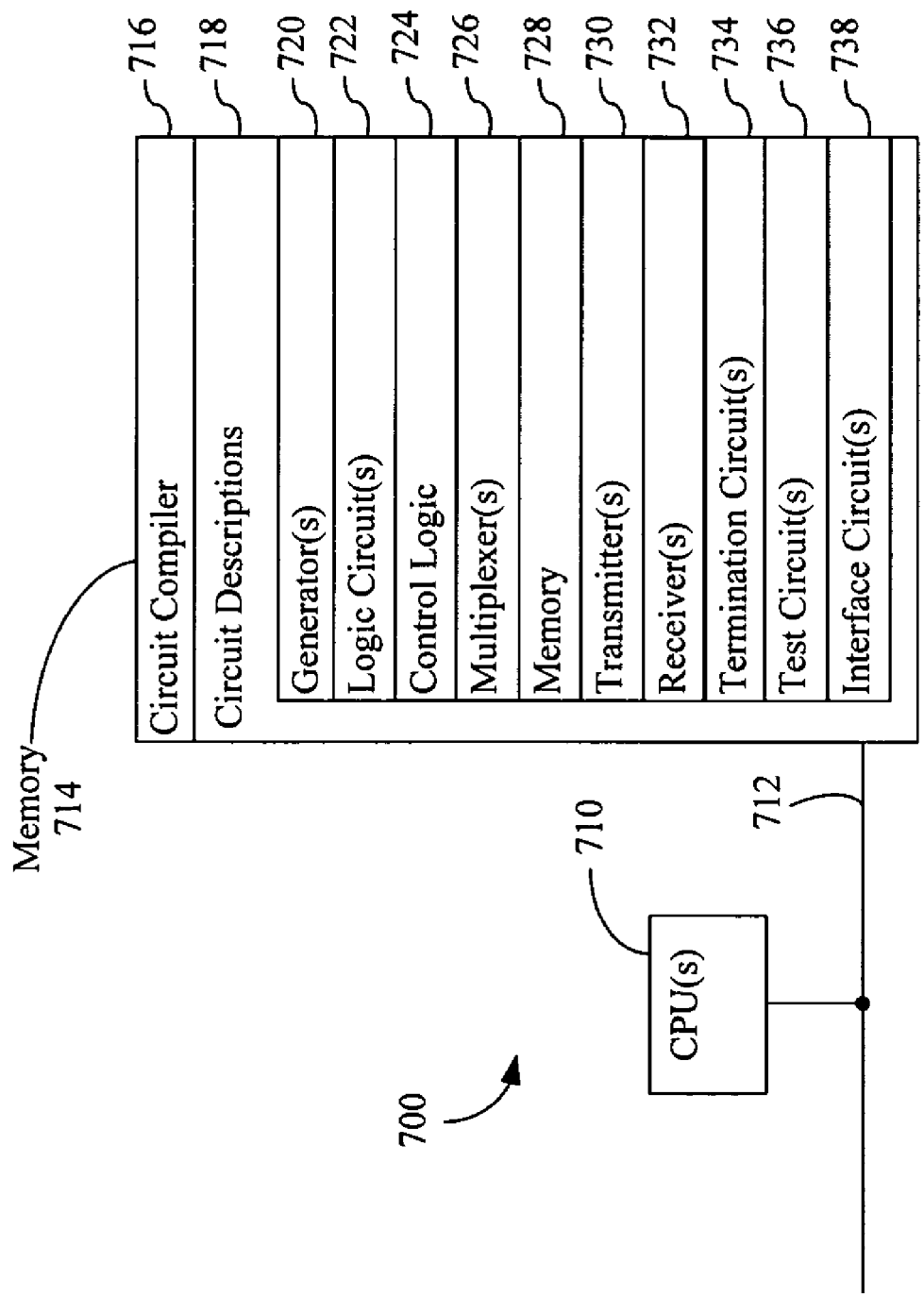
FIG. 7 is a block diagram illustrating an embodiment of a system.

FIG. 7 is a block diagram illustrating an embodiment of a system 700 for storing computer readable files containing software descriptions of the circuits. The system 700 may include at least one data processor or central processing unit (CPU) 710, memory 714 and one or more signal lines or communication busses 712 for coupling these components to one another. Memory 714 may include high-speed random access memory and/or non-volatile memory, such as one or more magnetic disk storage devices. Memory 714 may store a circuit compiler 716 and circuit descriptions 718. Circuit descriptions 718 may include circuit descriptions for the circuits, or a subset of the circuits discussed above with respect to FIG. 2. In particular, circuit descriptions 718 may include circuit descriptions of one or more generators 720, one or more logic circuits 722, one or more control logic circuits 724, one or more multiplexers 726, one or more memories 728, one or more transmitters 730, one or more receivers 732, one or more termination circuits 734, one or more test circuits 736, and/or one or more interface circuits 738.

The foregoing descriptions of specific embodiments of the present invention are presented for purposes of illustration and description. They are not intended to be exhaustive or to limit the invention to the precise forms disclosed. Rather, it should be appreciated that many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An integrated circuit, comprising:
an interface circuit, wherein the interface circuit includes a transmitter and a receiver;
a generator selectively coupled to the transmitter, wherein the generator is to provide a test sequence that is output by the transmitter during a test mode of operation;
a memory selectively coupled to the generator and the receiver, wherein the memory is to receive and synchronize the test sequence and a signal corresponding to the test sequence that is received by the receiver;
control logic to configure the integrated circuit in the test mode of operation, wherein the control logic is to selectively couple the generator to the transmitter and the memory, and is to selectively couple the receiver to the memory; and
a logic circuit to compare the test sequence and the signal.

2. The integrated circuit of claim 1, wherein the integrated circuit is included in a memory controller.

3. The integrated circuit of claim 1, wherein the integrated circuit is included in a memory device.

4. The integrated circuit of claim 1, wherein the test sequence is a pseudorandom sequence.

5. The integrated circuit of claim 1, wherein the test sequence includes burst patterns that result in transient and steady-state responses.

6. The integrated circuit of claim 1, wherein the memory includes a first-in first-out memory.

7. The integrated circuit of claim 1, wherein the transmitter is to be coupled to the receiver during the test mode of operation with a loop external to the integrated circuit.

8. The integrated circuit of claim 1, wherein the control logic is to further set a termination impedance of the transmitter and a termination impedance of the receiver.

9. The integrated circuit of claim 1, wherein the control logic is to further disable at least one additional transmitter and at least one additional receiver in the interface circuit.

10. The integrated circuit of claim 1, wherein the transmitter is to transmit a first set of data bits and a first clock signal in parallel with one another, and wherein the receiver is to receive a second set of data bits and a second clock signal in parallel with one another.

11. The integrated circuit of claim 1, wherein a relative phase of a clock signal that controls sampling of the signal by the receiver is adjustable over a range of values thereby allowing determination of a total channel margin.

12. The integrated circuit of claim 1, wherein the logic circuit is to assert an error condition if there is a difference between the test sequence and the signal.

13. An integrated circuit, comprising:
    first means for transmitting and receiving signals;
    second means, selectively coupled to the first means, for providing a test sequence that is output by the first means during a test mode of operation;
    third means, selectively coupled to the first means and the second means, for receiving and synchronizing the test sequence and a signal corresponding to the test sequence that is received by the first means;
    fourth means for comparing the test sequence and the signal; and
    fifth means for configuring the integrated circuit in the test mode of operation, wherein the control logic is to selectively couple the second means to the first means and the third means, and is to selectively couple the first means to the third means.

14. A computer readable medium containing data representing a circuit that includes:
    an interface circuit, wherein the interface circuit includes a transmitter and a receiver;
    a generator selectively coupled to the transmitter, wherein the generator is to provide a test sequence that is output by the transmitter during a test mode of operation;
    a memory selectively coupled to the generator and the receiver, wherein the memory is to receive and synchronize the test sequence and a signal corresponding to the test sequence that is transmitted by the transmitter and received by the receiver;
    control logic to configure the integrated circuit in the test mode of operation, wherein the control logic is to selectively couple the generator to the transmitter and the memory, and is to selectively couple the receiver to the memory; and
    a logic circuit to compare the test sequence and the signal.

15. The integrated circuit of claim 13, wherein the integrated circuit is included in a memory controller.

16. The integrated circuit of claim 13, wherein the integrated circuit is included in a memory device.

17. The integrated circuit of claim 13, wherein the test sequence is a pseudorandom sequence.

18. The integrated circuit of claim 13, wherein the test sequence includes burst patterns that result in transient and steady-state responses.

19. The integrated circuit of claim 13, wherein the memory includes a first-in first-out memory.

20. The integrated circuit of claim 13, wherein the transmitter is to be coupled to the receiver during the test mode of operation with a loop external to the integrated circuit.

21. The integrated circuit of claim 13, wherein the control logic is to further set a termination impedance of the transmitter and a termination impedance of the receiver.

22. The integrated circuit of claim 13, wherein the control logic is to further disable at least one additional transmitter and at least one additional receiver in the interface circuit.

23. The integrated circuit of claim 13, wherein the transmitter is to transmit a first set of data bits and a first clock signal in parallel with one another, and wherein the receiver is to receive a second set of data bits and a second clock signal in parallel with one another.

24. The integrated circuit of claim 13, wherein a relative phase of a clock signal that controls sampling of the signal by the receiver is adjustable over a range of values thereby allowing determination of a total channel margin.

25. The integrated circuit of claim 13, wherein the logic circuit is to assert an error condition if there is a difference between the test sequence and the signal.

26. An integrated circuit, comprising:
    an interface circuit, including a transmitter and a receiver, wherein the transmitter is to transmit a first set of data bits and a first clock signal in parallel with one another, and wherein the receiver is to receive a second set of data bits and a second clock signal in parallel with one another;
    a generator selectively coupled to the transmitter, wherein the generator is to provide a test sequence that is output by the transmitter during a test mode of operation;
    a memory selectively coupled to the generator and the receiver, wherein the memory is to receive and synchronize the test sequence and a signal corresponding to the test sequence that is received by the receiver; and
    a logic circuit to compare the test sequence and the signal.

* * * * *